United States Patent [19]

Goronkin et al.

[11] Patent Number: 5,221,849
[45] Date of Patent: Jun. 22, 1993

[54] SEMICONDUCTOR DEVICE WITH ACTIVE QUANTUM WELL GATE

[75] Inventors: Herbert Goronkin, Tempe; Jun Shen, Phoenix; Saied Tehrani, Scottsdale; X. Theodore Zhu, Chandler, all of Ariz.

[73] Assignee: Motorola, Inc., Schaumburg, Ill.

[21] Appl. No.: 899,439

[22] Filed: Jun. 16, 1992

[51] Int. Cl.$^5$ .............. H01L 29/161; H01L 29/205; H01L 29/225
[52] U.S. Cl. ................................ 257/20; 257/289; 257/366
[58] Field of Search .................... 357/16, 237; 257/20, 257/289, 366

[56] References Cited

U.S. PATENT DOCUMENTS

| | | | |
|---|---|---|---|
| 4,743,951 | 5/1988 | Chang et al. | 357/22 |
| 4,806,993 | 2/1989 | Voisin et al. | 357/4 |
| 4,817,103 | 3/1989 | Holonyak, Jr. et al. | 372/45 |
| 4,821,093 | 4/1989 | Iafrate et al. | 357/22 |

FOREIGN PATENT DOCUMENTS

| | | | |
|---|---|---|---|
| 57-147271 | 9/1982 | Japan | 357/16 |
| 60-186051 | 9/1985 | Japan | 357/23.7 |
| 61-54670 | 3/1986 | Japan | 357/16 |
| 62-45064 | 2/1987 | Japan | 357/16 |
| 3-192725 | 8/1991 | Japan | 357/16 |

OTHER PUBLICATIONS

Beresford et al, 'Interband Tunneling . . . ', Apply Phys Lttr, 56(10), Mar. 5, 1990, pp. 952–954.
Zhu et al, 'Exitonic Insulator Trans . . . ' Solid State Comm, vol. 75, No. 7, pp. 595–599, 1990.
Sercel et al, 'Concept for Self Doping Semi . . . ', Appl Phys Lttr, 57(15), Oct. 8, 1990, pp. 1569–1571.
Eisenstein et al, 'Field Induced Resonant Tunneling . . . ', Appl Phys Lttr, 58(14), Apr. 8, 1991, 1497–1499.

Primary Examiner—Andrew J. James
Assistant Examiner—Stephen D. Meier
Attorney, Agent, or Firm—Joe E. Barbee

[57] ABSTRACT

A field effect semiconductor device having multiple vertically stacked channels (12, 14, 16) separated by independent gate electrodes (13, 15) is provided. The channels (12, 14, 16) are formed on a wide bandgap buffer layer (11) and each channel is coupled a drain electrode (21). Each channel is also coupled to a source electrode (25-26). The quantum well channels (12, 14, 16) and quantum well gates (13, 15) are separated from each other by barrier layers (18) of a wide bandgap semiconductor material.

8 Claims, 1 Drawing Sheet

5,221,849

SEMICONDUCTOR DEVICE WITH ACTIVE QUANTUM WELL GATE

BACKGROUND OF THE INVENTION

This invention relates, in general, to semiconductor devices, and more particularly, to field effect transistors having multiple vertically aligned channels controlled by active quantum well gates.

Compound semiconductor based heterostructure devices have been predicted to offer significant speed and power advantages over silicon devices. Compound semiconductor devices that have multiple vertically stacked channels allow greater functionality to be incorporated into smaller devices. Conventional field effect devices use a gate electrode located on a surface of the device. In these "surface gated" devices, the gate is a passive element of the transistor. Moreover, the transconductance of the field effect transistor depends on the distance from the gate to the centroid of charge on the channel. The magnitude of the transconductance decreases when the channel is far from the gate.

In a device having multiple vertically stacked channels, the gate exerts a stronger effect on the closest channel and the weakest effect on the furthest channel. This results in non-uniform performance among the channels of a multiple channel device, and complicates designs that require matched performance among the channels. What is needed is a semiconductor device which can provide more uniform performance among multiple vertically stacked channels.

SUMMARY OF THE INVENTION

Briefly stated, the advantages of the present invention are achieved by a field effect semiconductor device having multiple vertically stacked channels Each of the channels is formed as a quantum well including a narrow bandgap layer having upper and lower surfaces covered by wide bandgap material layers. Each of the quantum well channels are separated by a semiconductor gate electrode comprising a material having a valence band energy greater than the conduction band energy of the narrow bandgap material. Each of the semiconductor gates is coupled to a means for providing charge to the gate.

DETAILED DESCRIPTION OF THE DRAWINGS

Figure 1:
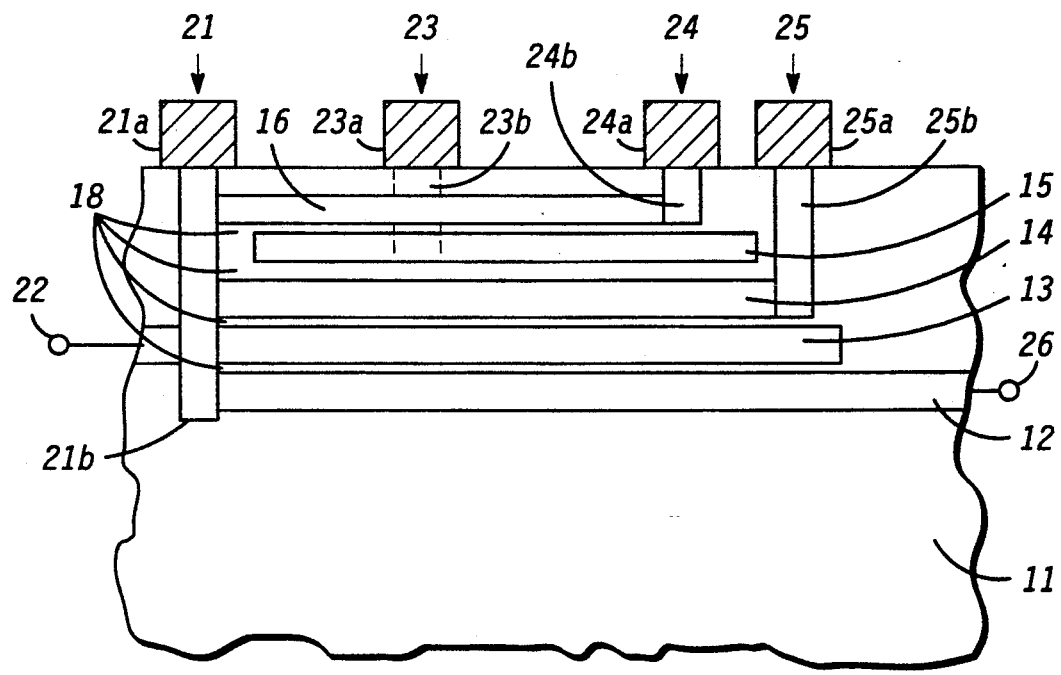
FIG. 1 illustrates a highly simplified cross section through a portion of a multi-functional semiconductor device in accordance with the present invention.

A primary concern in design of quantum well field effect transistors is the structure of the channel regions underneath the gate electrode as the channel region performance largely determines overall performance of the transistor. FIG. 1 illustrates a highly simplified cross section through channel regions of a multi-functional field effect transistor in accordance with the present invention. All material layers shown in FIG. 1, and subsequent embodiments of the present invention are substantially single crystal epitaxially grown layers. This requires that each epitaxial layer comprise a material which is crystallographically compatible with an underlying substrate. Therefore, in addition to electronic material constraints discussed hereinafter in regard to the particular embodiments, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

The embodiment shown in FIG. 1 includes a wide band gap buffer layer 11 comprising a material such as aluminum antimonide (AlSb) or aluminum gallium antimonide (AlGaSb) formed on a supporting crystalline substrate such as gallium arsenide (not shown). It may be desirable to use a superlattice (not shown) of AlSb and GaSb layers as a part of buffer layer 11 to smooth buffer layer 11. Other wide band gap materials are known and used in compound semiconductor devices, but, as will be seen, AlSb is desirable in the preferred embodiments to ensure compatibility with other materials used in overlying layers of the preferred embodiments.

A first N-channel quantum well 12 is formed covering buffer layer 11. N-channel quantum well 12 is approximately five to ten nanometers thick and comprises a narrow bandgap material such as indium arsenide (InAs) in the preferred embodiments. A first barrier layer 18 is formed over N-channel quantum well 12. Barrier 18 desirably comprises a wide band gap material such as AlSb or AlGaSb, and in the preferred embodiment is approximately three to four nanometers thick.

A first semiconductor quantum well gate 13 is formed covering barrier layer 18. In a preferred embodiment, semiconductor quantum well gate 13 is in the range of five to ten nanometers thick comprises gallium antimonide (GaSb). First semiconductor quantum well gate 13 can be doped directly or by modulation doping techniques to improve conductivity if desired. Semiconductor quantum well gate 13 is covered by a second barrier layer 18 having a thickness of approximately three to four nanometers and comprising a material with a wide band gap such as AlSb or AlGaSb.

A second N-channel quantum well 14 is formed covering the second barrier layer 18. N-channel quantum well 14 is approximately five to ten nanometers thick and comprises a material such as indium arsenide (InAs) in the preferred embodiments. Another barrier layer 18 is formed over second N-channel quantum well 14. Third barrier 18 also comprises a wide band gap material such as AlSb, and in the preferred embodiment is approximately three to four nanometers thick.

A second semiconductor quantum well gate 15 is formed covering the third barrier layer 18. In a preferred embodiment, second semiconductor quantum well gate 15 is in the range of five to ten nanometers thick comprises gallium antimonide (GaSb) Second semiconductor quantum well gate 15 can be doped directly or by modulation doping techniques to improve conductivity if desired. Semiconductor quantum well gate 15 is covered by a fourth barrier layer 18 having a thickness of approximately three to four nanometers and comprising a material with a wide band gap such as AlSb or AlGaSb.

A third N-channel quantum well 16 is formed covering the fourth barrier layer 18. N-channel quantum well 16 is approximately five to ten nanometers thick and comprises a material such as indium arsenide (InAs) in the preferred embodiments. Another barrier layer 18 is formed over second N-channel quantum well 14 and serves as a cap layer because it is the uppermost barrier layer. This uppermost barrier layer 18 also comprises a wide band gap material such as AlSb or AlGaSb, and in the preferred embodiment is approximately ten nanometers thick.

It should be noted that N-channel quantum wells 12, 14, and 16 are substantially undoped and that no charge supply layer need be placed in the barrier layers. This feature allows channels 12, 14, and 16 to have maximum mobility, increasing efficiency of the channels.

Electrode 21 is positioned on an upper surface of device 10 and includes a highly conductive semiconductor or metal surface portion 21a and a doped conductive region 21b extending from the upper surface through all of the narrow bandgap regions of channels 12, 14, and 16. Electrode 21 thus provides a common "source" for each of channels 12, 14, and 16. In a preferred embodiment electrode 21 is adapted for coupling to an external potential or power supply (not shown).

Drain electrodes 24 and 25 also comprise surface portions 24a and 25a which are highly conductive and used to interconnect devices to external or integrated circuitry (not shown). Drain electrodes 24–25 also comprise diffused portions 24b–25b which provide low resistivity coupling to channels 14 and 16. Alternatively, any of channels 12, 14, or 16 may couple to other devices (not shown) integrated on the same chip by lateral interconnections as suggested by terminal 26. In this adaptation, channel 12 is patterned to extend to another device and serves as a buried interconnect, eliminating the need for surface electrodes and interconnections.

Gate electrode 23 is positioned on an upper surface of device 10 and includes a highly conductive semiconductor or metal surface portion 23a and a doped conductive region 23b (indicated by dashed lines) extending from the upper surface to quantum well gate 15. Electrode 23 thus provides a means for providing charge to quantum well gate 15. Alternatively, any of quantum well gates 13 or 15 may couple to other devices (not shown) integrated on the same chip by lateral interconnections as suggested by terminal 22. In this adaptation, quantum well gate 13 is patterned to extend to another device and serves as a buried interconnect, eliminating the need for surface electrodes and interconnections.

Figure 2:
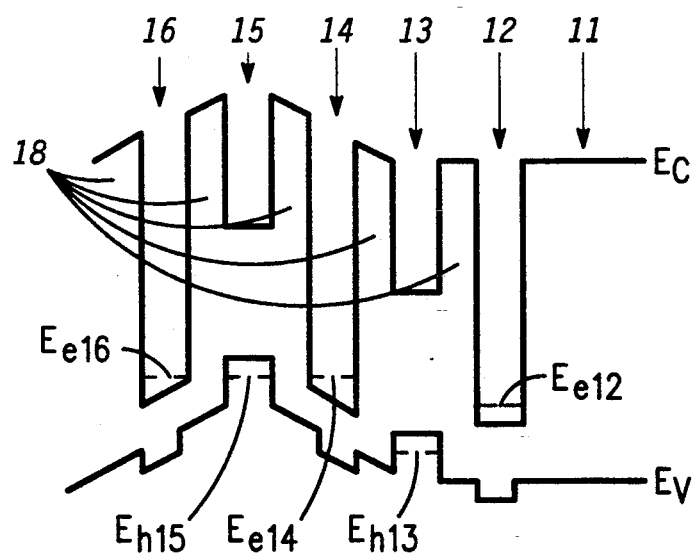
FIG. 2 illustrates a band diagram of the structure shown in FIG. 1 with an applied gate bias.

The particular materials for P-channel quantum wells 13 and 15 and N-channel quantum wells 12, 14 and 16 are chosen because P-channel quantum wells 13 and 15 should have a valence band energy greater than conduction band energy of N-channel quantum wells 12, 14, and 16 as illustrated in FIG. 2. Conduction band energy ($E_c$) and valence band energy ($E_v$) are illustrated in band diagram shown in FIG. 2. In FIG. 2, the vertical axis represents relative energy in electron volts, and the horizontal axis represents thickness or depth within the device structure shown in FIG. 1. The left hand side of the drawings is upper surface, while the right hand side of the drawings is the substrate.

Quantum well gates 13 and 15 as well as N-channel quantum wells 12, 14, and 16 are separated by wide band gap barriers 18. A quantized energy level for a first hole state ($\epsilon_{h13}$) exists in quantum well gate 13 and is indicated by a dashed line within quantum well gate 13. Likewise a quantized energy level for a first hole state ($\epsilon_{h15}$) exists in quantum well gate 15 and is indicated by a dashed line within quantum well gate 15. $\epsilon_{h13}$ and $\epsilon_{h15}$ lie at an energy somewhat lower than valence band energy for quantum well gates 13 and 15. The precise energy for $\epsilon_{h13}$ and $\epsilon_{h15}$ are determined by thickness of quantum wells gates 13 and 15. $\epsilon_{h13}$ is the minimum energy for holes in quantum well 13 while $\epsilon_{h15}$ is the minimum energy for holes in quantum well gate 15.

Likewise, $\epsilon_{e12}$, $\epsilon_{e14}$ and $\epsilon_{ei6}$ indicate a quantized energy level for a first electron state in N-channel quantum wells 12, 14, and 16 respectively. $\epsilon_{e12}$, $\epsilon_{e14}$ and $\epsilon_{e16}$ lie somewhat above conduction band energy for N-channel quantum wells 12, 14 and 16 and are also determined by thickness of N-channel quantum wells 12, 14 and 16. $\Delta\epsilon$ is an energy difference between bulk valence band energy and bulk conduction band energy in N-channel quantum wells 12, 14 and 16. When GaSb and InAs are used for the quantum wells, $\Delta\epsilon$ is about 0.175 eV.

The thickness of barriers 18 is designed to allow overlap between the electron wave function in N-channel quantum wells 12 and 14 and the hole wave function in adjacent quantum well gates 13. The thickness of barriers 18 is also designed to allow overlap between the electron wave function in N-channel quantum wells 14 and 16 and the hole wave function in adjacent quantum well gates 15. In other words, barriers 18 are thin enough that charge carriers can couple between the quantum well gates and the adjacent quantum well channels.

In operation, potential is applied to quantum well gates 13 or 15. The applied potential alters the bandgap relationship by raising or lowering the energy bands of quantum well gates 13 and 15 with respect to quantum well channels 12, 14, and 16. FIG. 2 illustrates this operation with quantum well gate 15 biased negative, while quantum well gate 13 is either unbiased, or biased positively. The magnitude of the bias on quantum well gate 15 is just sufficient to bring the ground state of quantum well gate 15 ($\epsilon_{h15}$) into alignment with the ground state energies ($\epsilon_{e14}$ and $\epsilon_{e16}$) of quantum well channels 14 and 16.

As illustrated in FIG. 2, when $\epsilon_{h15}$ is at a greater energy than $\epsilon_{e14}$ or $\epsilon_{e16}$, electrons in the valence band of quantum well gate 15 will prefer to move to N-channel quantum wells 14 and 16. This creates free electrons in N-channel quantum wells 14 and 16 making them conductive. FIG. 2 also illustrates that a zero or positive gate bias forces $\epsilon_{h13}$ to be less than $\epsilon_{e12}$ so that N-channel quantum well 12 is substantially free of charge carriers and is non-conductive. In this configuration, quantum well channels 14 and 16 carry charge while quantum well 12 remains empty. The charge state of all three quantum well channels can be varied independently of each other by coordinated gate action of the two quantum well gates 13 and 15.

As noted hereinbefore, $\epsilon_{e12}$, $\epsilon_{e14}$, $\epsilon_{e16}$, $\epsilon_{h13}$, and $\epsilon_{h15}$ vary with thickness of the quantum wells. For example, as quantum well gates 13 and 15 become thinner, $\epsilon_h$ becomes more separated from $E_v$. Likewise, as quantum well channels 12, 14, and 16 becomes thinner, $\epsilon_{e12}$, $\epsilon_{e14}$, and $\epsilon_{e16}$ become more separated from $E_c$. This aspect of the self doping structure shown in FIG. 1 can be used to create HFET structures having quantum well channels with a combination of depletion mode and enhancement mode characteristics.

Several features of the self-doping structure shown in FIG. 1 should be noted. First, the self-doping is simultaneous; both the N-channel and P-channel are activated with mobile charge to the same degree at the same time. Second, the nature of the materials used and the self-doping process results in a tremendous quantity of charge carriers being transferred between the wells so that once self-doping has occurred, charge carrier concentration is quite high in each of the quantum wells and conductivity is correspondingly high. Also, quantum wells 12, 14, and 16 are substantially free of impurities and thus achieve very close to their intrinsic mobility.

By now it should be appreciated that a field effect device having multiple vertically stacked channels with improved performance is provided. The multiple channel device structure in accordance with the present invention allows optimal use of superior materials for FET technology as well as efficient geometries for high packing density. Further, the HFET in accordance with the present invention provides multiple channels whose conductivity can be independently controlled and which are closely matched performance because each quantum well channel is separated from its controlling gate electrode by the same distance.

We claim:

1. A semiconductor device comprising: a crystalline substrate; a plurality of quantum well channels formed on the substrate, wherein each quantum well channel comprises a layer of narrow bandgap material having an upper and a lower surface, a wide bandgap layer covering the upper surface, and a wide bandgap layer covering the lower surface; a plurality of quantum well gates positioned between each of the quantum well channels, wherein each of the quantum well gates comprise a layer of material having a valence band energy greater than the conduction band energy of the narrow bandgap material; and a means for coupling a predetermined charge to each of the quantum well gates.

2. The semiconductor device of claim 1, wherein the device has an upper surface and further comprises a doped conductive region extending from the upper surface through all of the narrow bandgap regions.

3. The semiconductor device of claim 2 further comprising a conductive interconnect formed on the upper surface and electrically coupling to the doped conductive region, wherein the conductive interconnect is adapted to couple to ground potential.

4. The semiconductor device of claim 3 further comprising a plurality of drain electrodes electrically coupled to each of the narrow bandgap layers.

5. The semiconductor device of claim 1 wherein the means for coupling charge comprises a plurality of gate electrodes positioned on an upper surface of the device and extending downwards to couple to each of the quantum well gates.

6. The semiconductor device of claim 2 wherein the narrow bandgap material comprises indium arsenide, the wide bandgap material comprises aluminum antimonide, and the quantum well gates comprise gallium antimonide.

7. The semiconductor device of claim 6 wherein the narrow bandgap material comprises indium arsenide, the wide bandgap material comprises aluminum gallium antimonide, and the quantum well gates comprise gallium antimonide.

8. A semiconductor switch comprising: a crystalline substrate; a wide bandgap buffer layer covering the substrate;

- a first channel comprising a narrow bandgap material covering a portion of the buffer layer; a first wide bandgap barrier covering the first channel; a first quantum well gate covering the first barrier layer; a second wide bandgap barrier covering the first quantum well gate;
- a second channel comprising a narrow bandgap material covering a portion of the second barrier layer; a third wide bandgap barrier covering the second channel; a second quantum well gate covering the third barrier layer; a fourth barrier layer covering the second quantum well gate;
- a third channel comprising a narrow bandgap material covering a portion of the fourth barrier layer; a fifth wide bandgap barrier covering the third channel;
- a means for coupling charge to the first quantum well gate;
- a means for coupling charge to the second quantum well gate;
- a drain electrode coupled to each of the channels; and
- a means for conducting charge away from each of the channels.

* * * * *